United States Patent
Tsutsumi et al.

(10) Patent No.: US 10,793,712 B2
(45) Date of Patent: Oct. 6, 2020

(54) HEAT-CURABLE RESIN COMPOSITION FOR SEMICONDUCTOR ENCAPSULATION AND SEMICONDUCTOR DEVICE

(71) Applicant: Shin-Etsu Chemical Co., Ltd., Tokyo (JP)

(72) Inventors: Yoshihiro Tsutsumi, Annaka (JP); Naoyuki Kushihara, Annaka (JP); Norifumi Kawamura, Annaka (JP); Yuki Kudo, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 16/502,791

(22) Filed: Jul. 3, 2019

(65) Prior Publication Data
US 2020/0048454 A1    Feb. 13, 2020

(30) Foreign Application Priority Data
Aug. 9, 2018 (JP) .................................. 2018-150658

(51) Int. Cl.
*C08L 63/00* (2006.01)
*H01L 23/29* (2006.01)

(52) U.S. Cl.
CPC ............ *C08L 63/00* (2013.01); *H01L 23/296* (2013.01); *C08L 2203/206* (2013.01); *C08L 2205/025* (2013.01)

(58) Field of Classification Search
CPC .............. C08L 63/00; C08L 2203/206; C08L 2205/025; H01L 23/296
USPC ........................................................ 257/789
See application file for complete search history.

(56) References Cited

U.S. PATENT DOCUMENTS 8,728,712 B2 * 5/2014 Yabuki ..................... C08F 2/44
430/311
2006/0216520 A1   9/2006 Osada

FOREIGN PATENT DOCUMENTS

| JP | 7-216054 A | 8/1995 |
| JP | 2003-138103 A | 5/2003 |
| JP | 2005-213299 A | 8/2005 |
| JP | 2006-299246 A | 11/2006 |
| JP | 2018-24747 A | 2/2018 |

* cited by examiner

*Primary Examiner* — Tu-Tu V Ho
(74) *Attorney, Agent, or Firm* — Birch, Stewart, Kolasch & Birch, LLP

(57) ABSTRACT

Provided are a heat-curable resin composition for semiconductor encapsulation that is capable of yielding a cured product superior in tracking resistance and dielectric property, and has a favorable continuous moldability; and a semiconductor device encapsulated by a cured product of such resin composition. The heat-curable resin composition for semiconductor encapsulation contains:

(A) an epoxy resin other than a silicone-modified epoxy resin, being solid at 25° C.;
(B) a silicone-modified epoxy resin;
(C) a cyclic imide compound having, in one molecule, at least one dimer acid backbone, at least one linear alkylene group having not less than 6 carbon atoms, at least one alkyl group having not less than 6 carbon atoms, and at least two cyclic imide groups;
(D) an organic filler; and
(E) an anionic curing accelerator.

6 Claims, No Drawings

HEAT-CURABLE RESIN COMPOSITION FOR SEMICONDUCTOR ENCAPSULATION AND SEMICONDUCTOR DEVICE

BACKGROUND OF THE INVENTION

Field of the Invention

The present invention relates to a heat-curable resin composition for semiconductor encapsulation and a semiconductor device using the same.

Background Art

As an electronic part used in an electronic device, there is known a semiconductor package obtained by encapsulating a semiconductor element with a resin. Conventionally, such semiconductor package is usually manufactured via transfer molding of a tablet-shaped epoxy resin composition. Further, in recent years, as electronic devices have become smaller and lighter, electronic parts are now required to be mounted on wiring substrates in a highly dense manner, and even semiconductor packages are thus becoming smaller, thinner and lighter.

With these developments, the requirements for a semiconductor package material have become stricter than before. Especially, in the case of a semiconductor device employing surface mounting, as a result of exposing the semiconductor device to a high temperature at the time of performing solder reflow, peeling may occur in an interface between a semiconductor element(s) or a lead frame and a cured product of an epoxy resin composition as an encapsulation resin, and cracks may also occur in the semiconductor device, which may lead to failures significantly impairing the reliability of the semiconductor device.

As for these problems, there have been considered a method for reducing a stress occurring, at the time of performing reflow, in the interface between the semiconductor element(s) or lead frame and the cured product of the epoxy resin composition, by lowering the elasticity of the encapsulation resin; and a method for restricting the peeling in the interface by reducing the amount of water discharged as a result of lowering the water absorption rate of the encapsulation resin. Disclosed in JP-A-Hei-7-216054 is a resin composition comprising an epoxy resin containing a biphenyl-type epoxy resin; and a phenolic resin as a curing agent. However, such a kind of material often has a low crosslinking density, cannot easily exhibit a high glass-transition temperature (Tg), and may be inferior in a heat resistance such as a long-term heat resistance.

Meanwhile, an epoxy resin composition, particularly an epoxy resin composition comprising a non-biphenyl type epoxy resin and a phenolic curing agent can be turned into a cured product with a high Tg by increasing the crosslinking density of the composition. However, an excessively high crosslinking density tends to, in general, turn the cured product into a rigid structural body with a higher elastic modulus, and may lead to a higher water absorption rate as many hydroxyl groups will be formed.

Further, under the circumstance where semiconductor packages used are becoming lighter, thinner, shorter and smaller, which makes it difficult to sufficiently secure an insulation distance(s), general epoxy resin compositions that have been used so far may not necessarily be able to exhibit a satisfactory electric property, especially a satisfactory insulation property. This is considered as attributed to the phenyl groups that are present in the epoxy resin.

JP-A-2005-213299 discloses a composition comprising, as an essential component, a dicyclopentadiene-type epoxy resin for the purpose of improving a tracking resistance with the epoxy resin itself. In recent years, in order to keep up with a highly-demanded high CTI (Comparative Tracking Index), it is insufficient to only use a dicyclopentadiene-type epoxy resin.

In this way, epoxy resin compositions used in semiconductor packages that are becoming lighter, thinner, shorter and smaller in recent years, have a difficulty in achieving multiple properties at the same time. In order to solve these problems, there has been considered a resin composition combining an epoxy resin and a maleimide compound. JP-A-2003-138103 and JP-A-2006-299246 disclose the fact that a cured product of a resin composition containing an epoxy resin and a rigid maleimide compound has a high Tg and a high moisture resistance. However, the cured products of the epoxy resin compositions described in JP-A-2003-138103 and JP-A-2006-299246 had problems of, for example, exhibiting a high elastic modulus at a high temperature, and being inferior in reflow resistance.

Further, JP-A-2018-24747 discloses the fact that a cured product of a resin composition comprising an epoxy resin and a bismaleimide compound having aliphatic hydrocarbon groups on a main chain thereof is superior in reflow resistance. However, the problem with this composition is, for example, such that since the aliphatic hydrocarbon groups on the main chain of such bismaleimide compound will decompose by a long-term test, and since the compatibility between the epoxy resin and the maleimide compound is poor, an unfavorable mold releasability may be exhibited as resin can more easily adhere to a mold at the time of performing molding.

SUMMARY OF THE INVENTION

Thus, it is an object of the present invention to provide a resin composition capable of yielding a cured product superior in tracking resistance (high CTI) and dielectric property (low permittivity and low dielectric tangent), and having a favorable continuous moldability; and a semiconductor device encapsulated by the cured product of this resin composition.

The inventors of the present invention conducted a series of studies to solve the aforementioned problems, and completed the invention as follows. Specifically, the inventors found that the following heat-curable resin composition was capable of achieving the abovementioned objectives.

[1]

A heat-curable resin composition for semiconductor encapsulation, containing:

(A) an epoxy resin other than a silicone-modified epoxy resin, being solid at 25° C.;

(B) a silicone-modified epoxy resin;

(C) a cyclic imide compound having, in one molecule, at least one dimer acid backbone, at least one linear alkylene group having not less than 6 carbon atoms, at least one alkyl group having not less than 6 carbon atoms, and at least two cyclic imide groups;

(D) an organic filler; and (E) an anionic curing accelerator.

[2]

The heat-curable resin composition for semiconductor encapsulation according to [1], wherein the silicone-modified epoxy resin (B) is an addition compound of an alkenyl group-containing epoxy compound and an organohydrogenpolysiloxane represented by the following average formula (1):

wherein $R^1$ independently represents a monovalent hydrocarbon group having 1 to 10 carbon atoms; a represents a positive number of $0.01 \leq a \leq 1$; b represents a positive number of $1 \leq b \leq 3$; and a and b satisfy $1.01 \leq a+b \leq 4$.

[3]

The heat-curable resin composition for semiconductor encapsulation according to [1] or [2], wherein the component (C) is a cyclic imide compound being solid at 25° C.

[4]

The heat-curable resin composition for semiconductor encapsulation according to any one of [1] to [3], wherein the cyclic imide compound as the component (C) is represented by the following general formula (2):

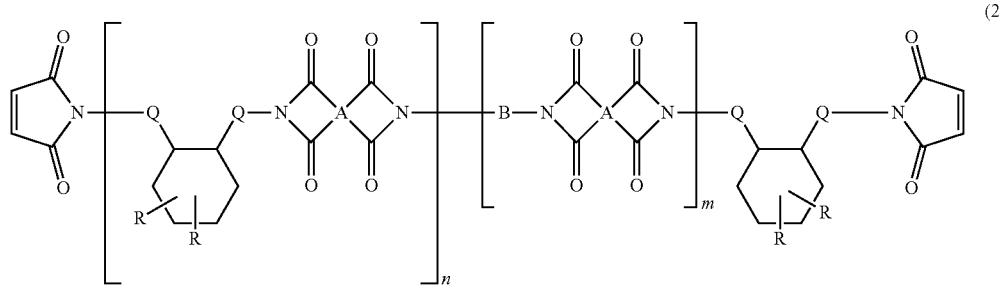

wherein A independently represents a tetravalent organic group having an aromatic or aliphatic ring; B represents an alkylene chain having 6 to 18 carbon atoms and a divalent aliphatic ring that may contain a hetero atom; Q independently represents a linear alkylene group having not less than 6 carbon atoms; R independently represents a linear or branched alkyl group having not less than 6 carbon atoms; n represents a number of 1 to 10; and m represents a number of 0 to 10.

[5]

The heat-curable resin composition for semiconductor encapsulation according to [4], wherein A in the general formula (2) has any one of the following structures:

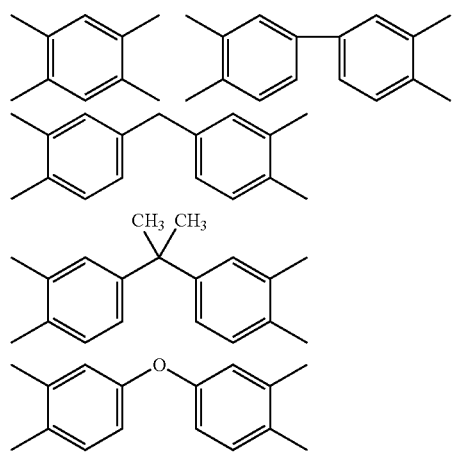

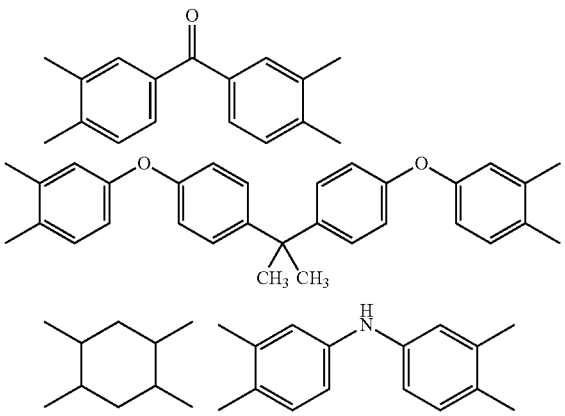

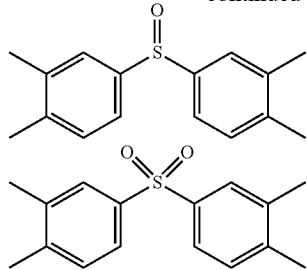

wherein bonds in the above structural formulae that are yet unbonded to substituent groups are to be bonded to carbonyl carbons forming cyclic imide structures in the general formula (2).

[6]

A semiconductor device encapsulated by a cured product of the heat-curable resin composition for semiconductor encapsulation according to any one of [1] to [5].

The heat-curable resin composition of the present invention has an excellent continuous moldability. Further, the cured product thereof is superior in tracking resistance (high CTI value) and dielectric property (low permittivity and low dielectric tangent). Thus, the heat-curable resin composition of the present invention is useful as a heat-curable resin composition for semiconductor device encapsulation.

DETAILED DESCRIPTION OF THE INVENTION (A) Epoxy Resin

An epoxy resin as a component (A) used in the present invention has at least two epoxy resins in one molecule, and is solid at 25° C. in terms of moldability and handling property. Further, it is preferred that the epoxy resin as the component (A) used in the present invention be a solid having a melting point of 40 to 150° C., or a softening point of 50 to 160° C.

Here, the epoxy resin as the component (A) is an epoxy resin other than a later-described silicone-modified epoxy resin as a component (B). The components (A) and (B) differ from each other.

Specific examples of the epoxy resin as the component (A) include a bisphenol A-type epoxy resin; a bisphenol F-type epoxy resin; biphenol type epoxy resins such as 3,3', 5,5'-tetramethyl-4,4'-biphenol type epoxy resin and 4,4'-biphenol type epoxy resin; a phenol novolac-type epoxy resin; a cresol novolac-type epoxy resin; a bisphenol A novolac-type epoxy resin; a naphthalenediol-type epoxy resin; a trisphenylol methane-type epoxy resin; a tetrakisphenylol ethane-type epoxy resin; a phenol biphenyl-type epoxy resin; an epoxy resin prepared by hydrogenating the aromatic rings in a dicyclopentadiene-type epoxy resin; an epoxy resin prepared by hydrogenating the aromatic rings in a phenol dicyclopentadiene novolac-type epoxy resin; a triazine derivative epoxy resin; and an alicyclic epoxy resin. Among these examples, a bisphenol A-type epoxy resin, a bisphenol F-type epoxy resin, a trisphenylol methane-type epoxy resin, a tetrakisphenylol ethane-type epoxy resin and a dicyclopentadiene-type epoxy resin are, for example, used preferably.

Any one of the above epoxy resins may be used singularly, or two or more of them may be used in combination.

(B) Silicone-Modified Epoxy Resin

The present invention contains a silicone-modified epoxy resin as the component (B). There are no particular restrictions on such silicone-modified epoxy resin, as long as it has at least two epoxy groups in one molecule and is modified with silicone. However, it is preferred that this silicone-modified epoxy resin be an addition compound of an alkenyl group-containing epoxy compound and an organohydrogenpolysiloxane represented by the following average formula (1):

$$H_a R^1_b SiO_{(4-(a+b))/2} \tag{1}$$

In the formula (1), $R^1$ independently represents a monovalent hydrocarbon group having 1 to 10 carbon atoms; a represents a positive number of $0.01 \leq a \leq 1$; b represents a positive number of $1 \leq b \leq 3$; and a and b satisfy $1.01 \leq a+b < 4$.

The addition compound of the alkenyl group-containing epoxy compound and the organohydrogenpolysiloxane represented by the above average formula (1) can be obtained by a hydrosilylation reaction of alkenyl groups and SiH groups. Since the composition of the present invention contains such addition compound, a compatibility between the component (A) and a later-described component (C) can be improved, thereby reducing mold pollution, and thus improving a continuous moldability.

Such alkenyl group-containing epoxy compound can be obtained by, for example, epoxidizing an alkenyl group-containing phenolic resin with epichlorohydrin, or partially reacting 2-allylphenol with a conventional and known epoxy compound. The alkenyl group-containing epoxy compound is that capable of being represented by the following general formula (4) or (5).

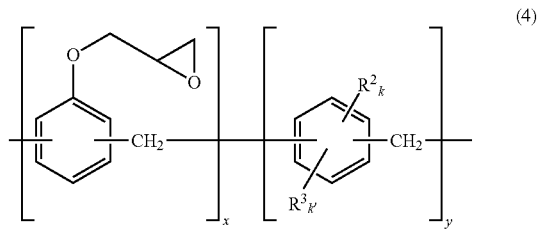

In the formula (4), $R^2$ represents an alkenyl group having 3 to 15, preferably 3 to 6 carbon atoms; $R^3$ represents a glycidyloxy group or a group expressed by $OCH_2CH(OH)CH_2OR^{10}$, preferably a glycidyloxy group; $R^{10}$ represents an alkenyl group having 3 to 10, preferably 3 to 6 carbon atoms; k represents 1; k' represents 0 or 1; x represents a number of 1 to 30, preferably 5 to 25; and y represents a number of 1 to 3, preferably 1 to 2. The repeating units may be randomly bonded to one another. Here, the compound represented by the formula (4) has at least one alkenyl group in one molecule.

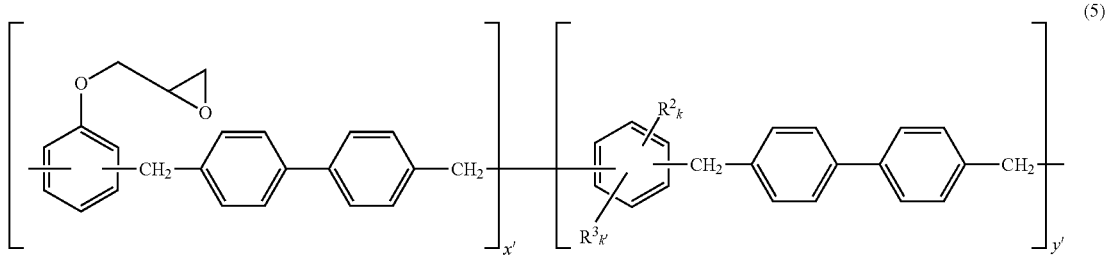

In the formula (5), $R^2$, $R^3$, k and k' are defined as above; x' represents a number of 1 to 30, preferably 5 to 25; y' represents a number of 1 to 3, preferably 1 to 2. The repeating units may be randomly bonded to one another. Here, the compound represented by the formula (5) has at least one alkenyl group in one molecule.

The organohydrogenpolysiloxane represented by the above average formula (1) has at least one SiH group, preferably at least two SiH groups, in one molecule. In the formula (1), $R^1$ represents a monovalent hydrocarbon group having 1 to 10, preferably 1 to 4 carbon atoms. Specific examples of such monovalent hydrocarbon group include alkyl groups such as a methyl group, an ethyl group, a propyl group, an isopropyl group, a butyl group, an isobutyl group, a tert-butyl group, a pentyl group, a neopentyl group, a hexyl group, an octyl group, a nonyl group and a decyl group; aryl groups such as a phenyl group, a tolyl group, a xylyl group and a naphthyl group; aralkyl groups such as a benzyl group, a phenylethyl group and a phenylpropyl group; and groups prepared by substituting a part of or all the hydrogen atoms in any of the above groups with halogen atoms such as fluorine, bromine and chlorine. Among these groups, a methyl group, an ethyl group and a phenyl group are preferred.

Further, in the formula (1), a represents a number satisfying $0.01 \leq a \leq 1$, preferably $0.1 \leq a \leq 0.9$; b represents a number satisfying $1 \leq b \leq 3$, preferably $1.2 \leq b \leq 2.8$; a+b satisfies $1.01 \leq a+b \leq 4$, preferably $1.3 \leq a+b \leq 3.7$ The organohydrogenpolysiloxane represented by the above average formula (1) may be linear, cyclic or branched, and is that capable of being expressed by the following formulae (6) to (8).

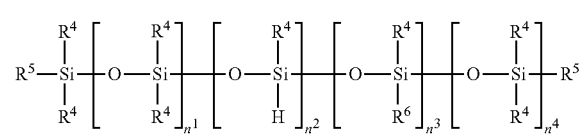

(6)

In the formula (6), each $R^4$ independently represents a monovalent hydrocarbon group having 1 to 10 carbon atoms; $R^5$ represents a hydrogen atom or a group selected from the options of $R^4$; $R^6$ represents a group expressed by the following formula (6'); $n^1$ represents a number of 5 to 200, preferably 9 to 80; $n^2$ represents a number of 0 to 2, preferably 0 to 1; $n^3$ represents a number of 0 to 10, preferably 0 to 5; and $n^4$ represents 1 or 0. Here, the compound represented by the formula (6) has, in one molecule, at least one silicon atom-bonded hydrogen atom.

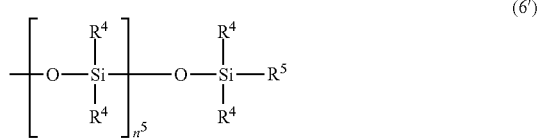

(6')

In the formula (6'), $R^4$ and $R^5$ are defined as above; and $n^5$ represents a number of 1 to 10.

In the formulae (6) and (6'), each of $R^4$ and $R^5$ may be those listed above as the specific examples of R1; and the preferable examples of each of $R^4$ and $R^5$ are a methyl group, an ethyl group and a phenyl group, as is the case with R'.

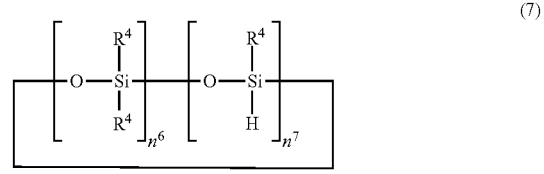

(7)

In the formula (7), $R^4$ is defined as above; $n^6$ represents a number of 1 to 10, preferably 1 to 5; and $n^7$ represents 1 or 2.

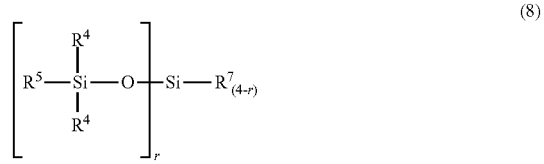

(8)

In the formula (8), $R^4$ and $R^5$ are defined as above; r represents a number of 0 to 3; $R^7$ represents a monovalent hydrocarbon group that has 1 to 10 carbon atoms, and may have a hydrogen or oxygen atom(s). Here, the compound represented by the formula (8) has, in one molecule, at least one silicon atom-bonded hydrogen atom.

As the above organohydrogenpolysiloxane, there can be listed siloxane compounds each having an SiH group at both ends, such as a dual-end type hydrogenmethylpolysiloxane, and a dual-end type hydrogen methylphenyl polysiloxane.

The component (B) is a copolymer obtained by subjecting the abovementioned alkenyl group-containing epoxy compound and the abovementioned organohydrogenpolysiloxane to a hydrosilylation reaction. The hydrosilylation reaction may be performed in accordance with a conventional and known method; and may, for example, be performed via a thermal reaction under the presence of a platinum-based catalyst such as chloroplatinic acid. It is particularly preferred that such hydrosilylation reaction be carried out by heating the compounds to 60 to 150° C. in an inactive solvent such as toluene, xylene and methylisobutyl ketone. The alkenyl group-containing epoxy compound and the organohydrogenpolysiloxane are to be combined at a ratio where the number of the SiH groups in the organohydrogenpolysiloxane is not smaller than 1.0, preferably 1.5 to 5.0, per one alkenyl group in the alkenyl group-containing epoxy compound.

Specific examples of the component (B) which is the addition compound of the alkenyl group-containing epoxy compound and the organohydrogenpolysiloxane represented by the average formula (1), include compounds represented by the following formulae (9) and (10). Any one of these compounds may be used singularly, or two or more of them may be used in combination.

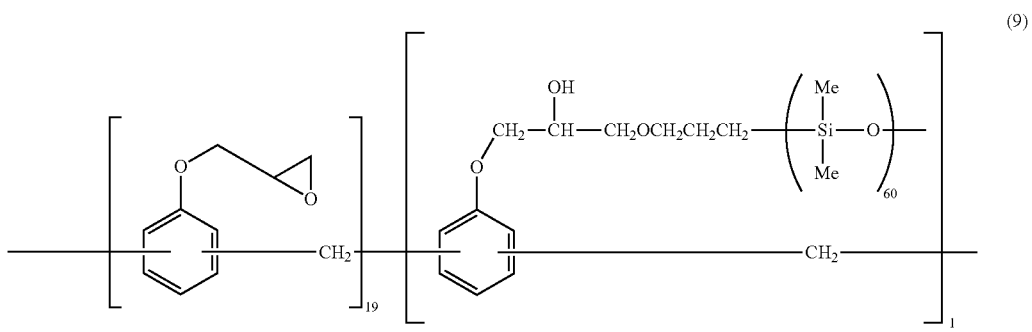

(9)

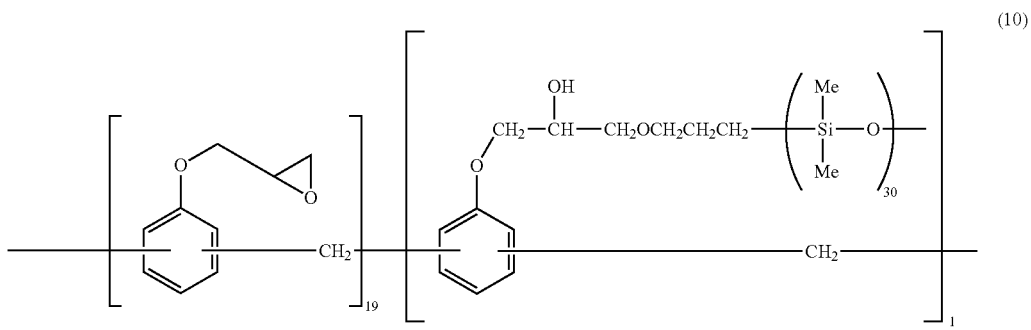

(10)

In the formulae (9) and (10), Me represents a methyl group.

The addition compounds represented by the above formulae (9) and (10) can be synthesized by a known method. In short, a phenol novolac resin modified with allylglycidylether, chloromethyloxirane and cetyltrimethylammonium bromide are put into a four-necked flask equipped with a reflux condenser, a thermometer, a stirrer and a drip funnel, and are then heated in a way such that they are stirred and mixed at 110° C. for three hours. The mixture is then cooled to 70° C., and the pressure is reduced to 160 mmHg, followed by spending three hours in delivering thereinto by drops a 50% aqueous solution of sodium hydroxide while performing azeotropic dehydration. The content obtained is then subjected to pressure reduction to distil away the solvent, followed by dissolving such content into a mixed solvent of methylisobutylketone and acetone, and then washing the same with water. An allyl group-containing epoxy compound is then obtained by distilling away the solvent under a reduced pressure.

Methylisobutylketone and a 2-ethylhexanol-modified chloroplatinic acid solution are then put into this epoxy compound to perform azeotropic dehydration for an hour, followed by spending 30 min in delivering thereinto by drops a target organohydrogenpolysiloxane at a reflux temperature. Here, when obtaining the addition compound represented by the formula (9), the target organohydrogenpolysiloxane refers to a dimethylpolysiloxane having one SiH group at both ends and 58 dimethylsiloxane repeating units. When obtaining the addition compound represented by the formula (10), the target organohydrogenpolysiloxane refers to a dimethylpolysiloxane having one SiH group at both ends and 28 dimethylsiloxane repeating units. In addition, the organohydrogenpolysiloxane is delivered by drops at a quantity ratio where the allyl groups in the allyl group-containing epoxy compound are in an amount of 2.1 mol per 1 mol of the SiH groups in such organohydrogenpolysiloxane. Further, after carrying out the reaction while performing stirring at the same temperature for four hours, a content obtained is then washed with water, followed by distilling away the solvent under a reduced pressure.

With the abovementioned method, the addition compounds represented by the formulae (9) and (10) can be obtained as copolymers that are whitish yellow transparent to opaque solids.

(C) Cyclic Imide Compound

A component (C) is a cyclic imide compound, and has, in one molecule, at least one dimer acid backbone, at least one linear alkylene group having not less than 6 carbon atoms, and at least two cyclic imide groups. Since the cyclic imide compound as the component (C) has the linear alkylene group(s) having not less than 6 carbon atoms, the cured product of a composition containing the same not only has a superior dielectric property, but also has a lower phenyl group content ratio and an improved tracking resistance. Further, since the cyclic imide compound as the component (C) has the linear alkylene group(s), the cured product of a composition containing the same is able to exhibit a lower elasticity, which is effective in reducing a stress applied to a semiconductor device by the cured product.

In terms of handling property, it is preferred that the cyclic imide compound as the component (C) be that being solid at 25° C.

Particularly, it is preferred that the cyclic imide compound as the component (C) be a maleimide compound, more preferably a maleimide compound represented by the following general formula (2):

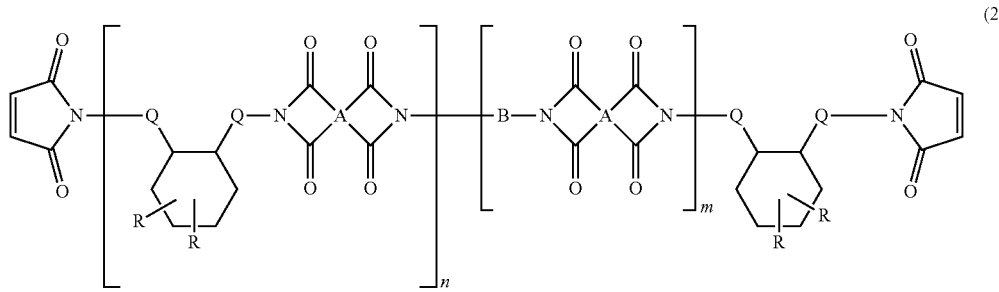

In the general formula (2), A independently represents a tetravalent organic group having an aromatic or aliphatic ring. B represents an alkylene chain having 6 to 18 carbon atoms and a divalent aliphatic ring that may contain a hetero atom. Q independently represents a linear alkylene group having not less than 6 carbon atoms. R independently represents a linear or branched alkyl group having not less than 6 carbon atoms. n represents a number of 1 to 10. m represents a number of 0 to 10.

Q in the formula (2) represents a linear alkylene group having not less than 6 carbon atoms. It is preferred that such linear alkylene group represented by Q have 6 to 20, more preferably 7 to 15 carbon atoms. Further, while R in the formula (2) has not less than 6 carbon atoms, it is preferred that each R have 6 to 12 carbon atoms, and each R may be either a linear or branched alkyl group.

A in the formula (2) represents a tetravalent organic group having an aromatic or aliphatic ring. Particularly, it is preferred that such organic group be any one of the tetravalent organic groups represented by the following structural formulae:

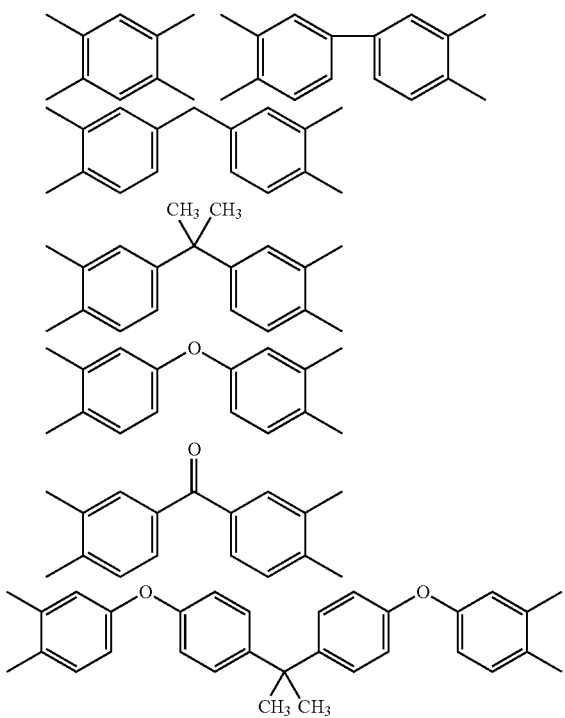

-continued

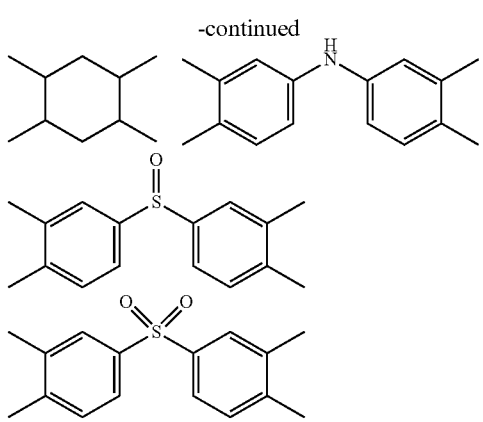

Here, bonds in the above structural formulae that are yet unbonded to substituent groups are to be bonded to carbonyl carbons forming cyclic imide structures in the general formula (2).

Further, while B in the formula (2) represents an alkylene chain having 6 to 18 carbon atoms and a divalent aliphatic ring that may contain a hetero atom, it is preferred that the alkylene chain have 8 to 15 carbon atoms.

n in the formula (2) represents a number of 1 to 10, preferably 2 to 7. m in the formula (2) represents a number of 0 to 10, preferably 0 to 7.

There are no particular restrictions on a weight-average molecular weight (Mw) of the cyclic imide compound as the component (C). However, it is preferred that a weight-average molecular weight thereof in terms of polystyrene that is measured by gel permeation chromatography (GPC) be 2,000 to 50,000, particularly preferably 2,500 to 40,000, and even more preferably 3,000 to 20,000. When such molecular weight is not lower than 2,000, the maleimide compound will solidify easily. When such molecular weight is not higher than 50,000, a favorable moldability can be achieved in a sense that there will be no concern that the fluidity of the composition obtained may decrease due to an excessively high viscosity thereof.

Here, the notation "Mw" in the present invention refers to a weight-average molecular weight that is measured by GPC under the following conditions, and is expressed in terms of polystyrene as a reference material.

Measurement Condition
  Developing solvent: tetrahydrofuran
  Flow rate: 0.35 mL/min
  Detector: RI
  Column: TSK-GEL H type (by Tosoh Corporation)
  Column temperature: 40° C.
  Sample injection amount: 5 μL As the cyclic imide compound as the component (C), there may be used commercially available products such as BMI-2500, BMI-2560, BMI-3000 and BMI-5000 (all of which are produced by Designer Molecules Inc.).

Further, only one kind of a cyclic imide compound may be used singularly, or multiple kinds of cyclic imide compounds may be used in combination.

In the composition of the present invention, it is preferred that the component (A) be contained in an amount of 40 to 90% by mass, the component (B) be contained in an amount of 3 to 40% by mass, and the component (C) be contained in an amount of 3 to 40% by mass, with respect to a sum total of the components (A), (B) and (C) serving as heat-curable resin components.

Further, it is preferred that the components (A), (B) and (C) as the heat-curable resin components be contained in the composition of the present invention, by an amount of 8 to 50% by mass, more preferably 9 to 45% by mass, and even more preferably 10 to 40% by mass.

(D) Inorganic Filler

An inorganic filler as a component (D) is added to improve the strength of the cured product of the heat-curable resin composition of the present invention. As the inorganic filler as the component (D), there may be used those normally added to an epoxy resin composition or a silicone resin composition. For example, there may be used silicas such as a spherical silica, a molten silica and a crystalline silica; alumina; silicon nitride; aluminum nitride; boron nitride; a glass fiber; and a glass particle(s).

While there are no particular restrictions on the average particle size and shape of the inorganic filler as the component (D), the average particle size thereof is preferably 3 to 40 μm. As the component (D), a spherical silica having an average particle size of 0.5 to 40 μm is preferably used. Here, the average particle size is defined as a value obtained as a mass average value $D_{50}$ (or median diameter) in a particle size distribution measurement that is carried out by a laser diffraction method.

Further, from the perspective of achieving a higher fluidity of the composition obtained, inorganic fillers with particle sizes from multiple ranges may be used in combination. In such case, it is preferred that there be combined spherical silicas with particle sizes belonging to a microscopic range of 0.1 to 3 μm, an intermediate range of 3 to 7 μm, and a coarse range of 10 to 40 μm. In order to achieve an even higher fluidity, it is preferred that there be used a spherical silica with an even larger average particle size.

It is preferred that the inorganic filler as the component (D) be employed in an amount of 300 to 1,000 parts by mass, particularly preferably 400 to 800 parts by mass, per the sum total of 100 parts by mass of the components (A), (B) and (C) as the heat-curable resin components. When such amount is smaller than 300 parts by mass, there exists a concern that a sufficient strength may not be achieved. When such amount is greater than 1,000 parts by mass, unfitting defects due to an increase in viscosity may occur, and a flexibility may be lost, which may then cause failures such as peeling in an element(s). Here, it is preferred that this inorganic filler be contained in an amount of 10 to 90% by mass, particularly preferably 20 to 85% by mass, with respect to the whole composition.

(E) Anionic Curing Accelerator

An anionic curing accelerator as a component (E) is added to the heat-curable resin composition of the present invention. The anionic curing accelerator is to promote the reaction among the epoxy groups in the epoxy resin as the component (A) and the silicone-modified epoxy resin as the component (B); and the cyclic imide groups in the cyclic imide compound as the component (C).

In general, a radical reaction initiator is often used to promote the reaction of cyclic imide groups. In the present invention, it is not preferable to use a radical reaction initiator alone as far as the reaction with the epoxy groups is concerned. However, such radical reaction initiator may be used together with an anionic curing accelerator.

There are no particular restrictions on the anionic curing accelerator as the component (E), as long as it is capable of promoting the curing reaction of a general epoxy resin composition. Examples of such anionic curing accelerator include an amine-based compound such as 1,8-diazabicyclo [5,4,0]-7-undecene; an organic phosphorus compound such as triphenylphosphine and tetraphenylphosphonium-tetraborate salt; and an imidazole-based compound such as 2-methylimidazole and 1-benzyl-2-phenylimidazole. Here, imidazole-based compounds are preferably used.

Regardless of the kind(s) thereof, any one of these anionic curing accelerators may be used singularly, or two or more of them may be used in combination. Further, as described above, the anionic curing accelerator may also be used together with a radical reaction initiator. Such anionic curing accelerator is added in an amount of 0.1 to 10 parts by mass, preferably 0.2 to 5 parts by mass, per the sum total of 100 parts by mass of the components (A), (B) and (C) i.e. per the sum total of 100 parts by mass of the heat-curable resin components.

Other than the abovementioned components, the following optional component(s) may further be added to the composition of the present invention.

(F) Mold Release Agent

A mold release agent can be added to the heat-curable resin composition of the invention which is used for semiconductor encapsulation. The mold release agent as a component (F) is added to improve a mold releasability at the time of performing molding. There are no restrictions on such mold release agent, as long as the mold release agent employed is that used in a general heat-curable epoxy resin composition. While examples of the mold release agent include a natural wax (e.g. carnauba wax and rice wax) and a synthetic wax (e.g. acid wax, polyethylene wax and fatty acid ester), carnauba wax is preferred in terms of the mold releasability of the cured product.

It is preferred that the component (F) be added in an amount of 0.05 to 5.0% by mass, particularly preferably 1.0 to 3.0% by mass, with respect to the sum total of the components (A), (B) and (C) i.e. the sum total of the heat-curable resin components. When such amount of the component (F) added is smaller than 0.05% by mass, the cured product of the composition of the invention may not exhibit a sufficient mold releasability. When the amount of the component (F) added is greater than 5.0% by mass, the composition of the invention may bleed out, and the cured product of the composition may exhibit an adhesion failure, for example.

(G) Flame Retardant

A flame retardant can be added to the heat-curable resin composition of the invention which is used for semiconductor encapsulation, for the purpose of improving a flame retardancy. There are no particular restrictions on such flame retardant, and any known flame retardant may be used. For example, there may be used a phosphazene compound, a silicone compound, a zinc molybdate-supported talc, a zinc molybdate-supported zinc oxide, an aluminum hydroxide, a magnesium hydroxide, a molybdenum oxide and an antimony trioxide. Any one of these flame retardants may be used singularly, or two or more kinds of them may be used in combination. The flame retardant(s) is added in an amount of 2 to 20 parts by mass, preferably 3 to 10 parts by mass, per the sum total of 100 parts by mass of the components (A), (B) and (C) i.e. the sum total of 100 parts by mass of the heat-curable resin components.

(H) Coupling Agent

A coupling agent such as a silane coupling agent and a titanate coupling agent can be added to the heat-curable resin composition of the invention which is used for semiconductor encapsulation, for the purpose of, for example, improving a bonding strength between the heat-curable resin components; and the inorganic filler as the component (D), and improving an adhesiveness between such resin components and a metal lead frame or substrate.

Examples of such coupling agent include an epoxy functional alkoxysilane (e.g. 3-glycidoxypropyltrimethoxysilane, 3-glycidoxypropylmethyldiethoxysilane and β-(3,4-epoxycyclohexyl)ethyltrimethoxysilane), a mercapto functional alkoxysilane (e.g. γ-mercaptopropyltrimethoxysilane) and an amine functional alkoxysilane (e.g. γ-aminopropyltrimethoxysilane and N-2-(aminoethyl)-3-aminopropyltrimethoxysilane).

There are no particular restrictions on the amount of the coupling agent added and a surface treatment method thereof. Such amount and surface treatment method may be derived from a common procedure(s).

Further, the inorganic filler may be treated with the coupling agent in advance; or the composition may be produced while performing surface treatment by adding the coupling agent at the time of kneading the heat-curable resin components together with the inorganic filler.

It is preferred that the component (H) be contained in an amount of 0.1 to 8.0% by mass, particularly preferably 0.5 to 6.0% by mass, per the sum total of the components (A), (B) and (C) i.e. the sum total of the heat-curable resin components. When such amount of the component (H) is smaller than 0.1% by mass, an insufficient adhesion effect to a base material may be observed. When the amount of the component (H) is greater than 8.0% by mass, a viscosity may extremely decrease such that voids may occur.

Other Additives

If necessary, various types of additives may further be added to the heat-curable resin composition of the invention which is used for semiconductor encapsulation. On the premise that the effects of the present invention shall not be impaired, the additive(s) added may, for example, be an organopolysiloxane, a silicone oil, a thermoplastic resin, a thermoplastic elastomer, an organic synthetic rubber, a silicone powder, a light stabilizer, a pigment and/or a dye, for the purpose of improving resin properties; or, for example, be an ion trapping agent for the purpose of improving electrical properties. A fluorine-containing material such as a fluorine-coated filler may, for example, be further added for the purpose of improving the dielectric property, and a heat-curable resin such as a cyanate ester resin may also be added as well.

Further, in the present invention, it is preferable to avoid adding curing agents that are used in general epoxy resin compositions, such as a phenol-based curing agent, an amine-based curing agent and an acid anhydride-based curing agent. As a result of adding a curing agent, a poor curing balance may often be observed, which will often result in a poor moldability of the composition of the invention and poor properties after curing.

Production Method

There are no particular restrictions on a method for producing the composition of the present invention. For example, the components (A) to (E) and other components, if necessary, are to be blended together at given compounding ratios. Next, a mixer or the like is used to thoroughly and uniformly mix these components, followed by melting and mixing them with, for example, a heat roller, a kneader or an extruder. A product thus obtained is then cooled to be solidified, and is later crushed into pieces of an appropriate size. The resin composition thus obtained can be used as a molding material.

As the most general method for molding the resin composition, there can be listed a transfer molding method and a compression molding method. In a transfer molding method, a transfer molding machine is used to perform molding under a molding pressure of 5 to 20 N/mm$^2$ and at a molding temperature of 120 to 190° C. for a molding period of 30 to 500 sec, preferably at a molding temperature of 150 to 185° C. for a molding period of 30 to 180 sec. Further, in a compression molding method, a compression molding machine is used to perform molding at a molding temperature of 120 to 190° C. for a molding period of 30 to 600 sec, preferably at a molding temperature of 130 to 160° C. for a molding period of 120 to 600 sec. Moreover, in each molding method, post curing may further be performed at 150 to 225° C. for 0.5 to 20 hours.

If produced by the above method, the cured product of the heat-curable resin composition of the invention which is used for semiconductor encapsulation shall exhibit an excellent tracking resistance and an excellent dielectric property. The heat-curable resin composition of the invention which is used for semiconductor encapsulation, is especially suitable for encapsulating, for example, semiconductors and various types of in-car modules.

Working Example

The present invention is described in detail hereunder with reference to working and comparative examples. However, the invention is not limited to the following working examples.

(A) Epoxy Resin (A-1) Trisphenylol methane-type epoxy resin (EPPN-501H by Nippon Kayaku Co., Ltd.; epoxy equivalent 165, softening point 54° C.)

(A-2) Bisphenol A-type epoxy resin (jER-1001 by Mitsubishi Chemical Corporation; epoxy equivalent 475, softening point 64° C.)

(B) Silicone-Modified Epoxy Resin (B-1) Addition compound represented by the following formula (9) (by Shin-Etsu Chemical Co., Ltd.)

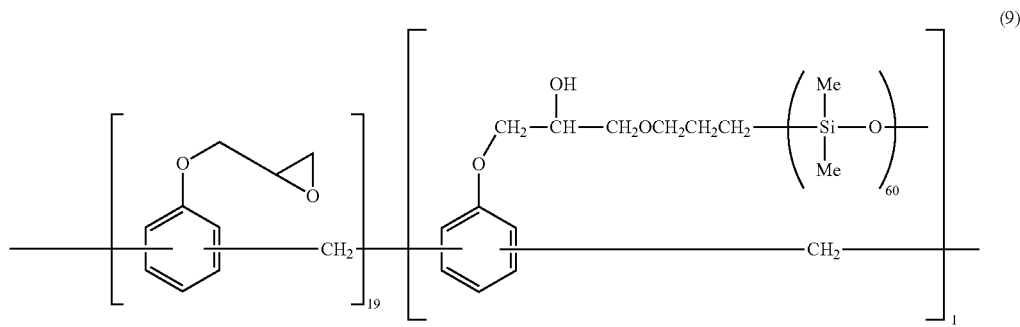
(B-2) Addition compound represented by the following formula (9) (by Shin-Etsu Chemical Co., Ltd.)
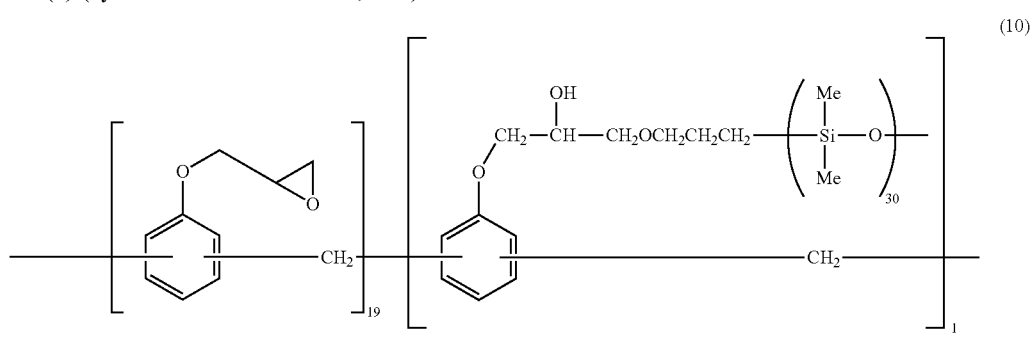
Here, the compounds represented by the formulae (9) and (10) were produced by the above method.
(C) Cyclic Imide Compound
(C-1) Maleimide compound represented by the following formula (weight-average molecular weight 3,000; BMI-3000 by Designer Molecules Inc.)
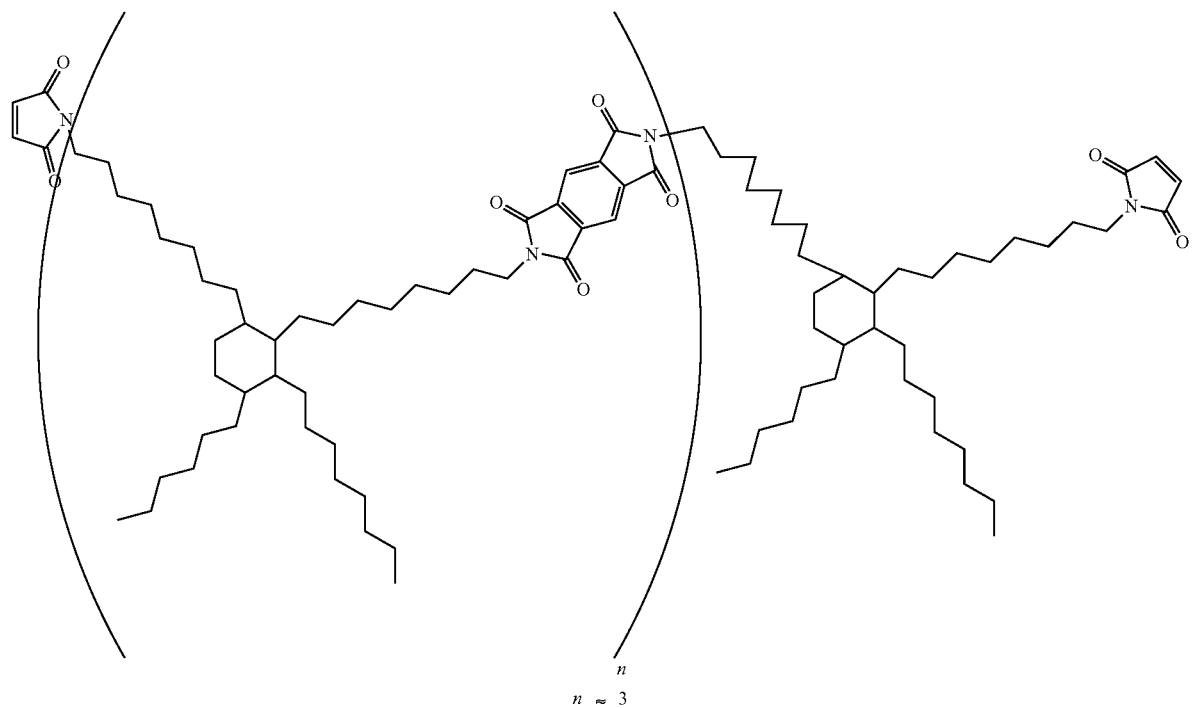

(C-2) 4,4'-diphenylmethanebismaleimide (BMI-1000 by Daiwa Fine Chemicals Co., Ltd.;
used in comparative example)
(D) Inorganic Filler
(D-1) Molten spherical silica (RS-8225H/53C by TATSUMORI LTD.; average particle size 13 μm)
(E) Anionic Curing Accelerator
(E-1) Imidazole-based curing accelerator (1B2PZ by SHIKOKU CHEMICALS CORPORATION)
(F) Mold Release Agent
(F-1) Carnauba wax (TOWAX-131 by TOA KASEI CO., LTD.)

Working Examples 1 to 8; Comparative Examples 1 to 7

The components in each example were melted and mixed together at the compounding ratios (parts by mass) shown in Tables 1 and 2, followed by cooling and then crushing a product thus prepared so as to obtain a resin composition. The following properties of each composition were evaluated. The results thereof are shown in Tables 1 and 2.

Spiral Flow Value

A mold manufactured in accordance with the EMMI standard was used to measure a spiral flow value of a molded body of the above heat-curable resin composition under a condition(s) of: molding temperature 175° C.; molding pressure 6.9 N/mm²; molding period 120 sec.

Bending Strength, Bending Elastic Modulus

A mold manufactured in accordance with JIS K 6911: 2006 was used to obtain a cured product of the above heat-curable resin composition under a condition(s) of: molding temperature 175° C.; molding pressure 6.9 N/mm²; molding period 120 sec. The cured product was then subjected to post curing at 180° C. for four hours.

A bending strength and bending elastic modulus of a specimen prepared from the post-cured cured product were then measured at room temperature (25° C.) in accordance with JIS K6911:2006.

Tracking Resistance Property (CTI) Test

A circular plate having a thickness of 3 mm and a diameter of 50 mm was molded under a condition(s) of: molding temperature 175° C.; molding pressure 6.9 N/mm²; molding period 120 sec. The cured product was then subjected to post curing at 180° C. for four hours. This cured product was then subjected to a tracking resistance property test that was performed by a method described in JIS C 2134 (IEC60112). A tracking resistance voltage was measured as follows. That is, in an evaluation test of five pieces of the cured product i.e. n=5, 50 or more droplets of a 0.1% ammonium chloride aqueous solution were delivered, and measured was the maximum voltage at which all the cured products had withstood the test without breakage. Here, the upper limit of the voltage was set to 600 V.

Relative Permittivity, Dielectric Tangent

A 70-mm squared molded piece having a thickness of 1 mm was prepared under a condition(s) of: molding temperature 175° C.; molding pressure 6.9 N/mm²; molding period 120 sec. A network analyzer (E5063-2D5 by Keysight Technologies) and a stripline (by KEYCOM Corporation) were then connected to the molded piece to measure a relative permittivity and dielectric tangent thereof at 1.0 GHz.

Continuous Moldability Test

A QFP (Quad Flat Package) (14 mm×20 mm×2.7 mm, 5 cavities) was molded using a continuous molding machine under a condition(s) of: molding temperature 175° C.; molding pressure 6.9 N/mm²; molding period 120 sec. Studied was the number of shots before failures such as an adhesion of the package to the mold or an adhesion of the cured product to the mold had occurred. Here, the upper limit was set to 350 shots.

As shown in Tables 1 and 2, the cured products of the composition of the present invention exhibited higher tracking resistance and smaller values of relative permittivity and dielectric tangent. Moreover, the composition of the present invention is also superior in continuous moldability. Thus, the composition of the present invention is useful as a material for encapsulating a semiconductor device.

TABLE 1

| | Composition Table (part by mass) | | | Working example | | | | | | | |
|---|---|---|---|---|---|---|---|---|---|---|---|
| | | | | 1 | 2 | 3 | 4 | 5 | 6 | 7 | 8 |
| (A) | Epoxy resin | EPPN-501H | A-1 | 60.0 | | 60.0 | | 85.0 | 40.0 | 80.0 | 80.0 |
| | | jER-1001 | A-2 | | 60.0 | | 60.0 | | | | |
| (B) | Silicone-modified | Formula(9) | B-1 | 10.0 | 10.0 | | | 10.0 | 20.0 | 3.0 | 17.0 |
| | epoxy resin | Formula(10) | B-2 | | | 10.0 | 10.0 | | | | |
| (C) | Cyclic imide | BMI-3000 | C-1 | 30.0 | 30.0 | 30.0 | 30.0 | 5.0 | 40.0 | 17.0 | 3.0 |
| | compound | BMI-1000 | C-2 | | | | | | | | |
| (D) | Inorganic filler | RS-8225H/53C | D-1 | 600.0 | 600.0 | 600.0 | 600.0 | 600.0 | 600.0 | 600.0 | 600.0 |
| (E) | Curing accelerator | 1B2PZ | E-1 | 1.0 | 1.0 | 1.0 | 1.0 | 1.0 | 1.0 | 1.0 | 1.0 |
| (F) | Mold release agent | TOWAX-131 | F-1 | 2.0 | 2.0 | 2.0 | 2.0 | 2.0 | 2.0 | 2.0 | 2.0 |
| Evalu- | Spiral flow | | inch | 25 | 22 | 23 | 20 | 29 | 18 | 23 | 30 |
| ation | Bending strength | | MPa | 100 | 121 | 103 | 113 | 123 | 98 | 110 | 116 |
| Result | Bending elastic modulus | | MPa | 12500 | 13000 | 11900 | 12000 | 14800 | 9000 | 13000 | 13900 |
| | Tracking resistance | | V | >600 | >600 | >600 | >600 | 600 | >600 | >600 | 600 |
| | Relative permittivity | | | 3.0 | 3.1 | 3.1 | 3.2 | 3.4 | 2.9 | 3.2 | 3.4 |
| | Dielectric tangent | | | 0.005 | 0.004 | 0.005 | 0.005 | 0.009 | 0.003 | 0.005 | 0.010 |
| | Continuous moldability | | Shots | >350 | >350 | >350 | 340 | >350 | 290 | 300 | >350 |

TABLE 2

|     | Composition Table (part by mass) |          |     | Comparative example ||||||| 
|     |     |     |     | 1 | 2 | 3 | 4 | 5 | 6 | 7 |
| --- | --- | --- | --- | --- | --- | --- | --- | --- | --- | --- |
| (A) | Epoxy resin | EPPN-501H | A-1 | 100.0 | 85.0 |  | 70.0 |  | 70.0 | 60.0 |
|     |     | jER-1001 | A-2 |  |  |  |  | 70.0 |  |  |
| (B) | Silicone-modified | Formula(9) | B-1 |  | 15.0 |  |  |  |  | 10.0 |
|     | epoxy resin | Formula(10) | B-2 |  |  |  |  |  |  |  |
| (C) | Cyclic imide | BMI-3000 | C-1 |  |  | 100.0 | 30.0 | 30.0 |  |  |
|     | compound | BMI-1000 | C-2 |  |  |  |  |  | 30.0 | 30.0 |
| (D) | Inorganic filler | RS-8225H/53C | D-1 | 600.0 | 600.0 | 600.0 | 600.0 | 600.0 | 600.0 | 600.0 |
| (E) | Curing accelerator | 1B2PZ | E-1 | 1.0 | 1.0 | 1.0 | 1.0 | 1.0 | 1.0 | 1.0 |
| (F) | Mold release agent | TOWAX-131 | F-1 | 2.0 | 2.0 | 2.0 | 2.0 | 2.0 | 2.0 | 2.0 |
| Evalu- | Spiral flow |  | inch | 21 | 20 | 34 | 29 | 32 | 30 | 33 |
| ation | Bending strength |  | MPa | 95 | 103 | 50 | 100 | 121 | 110 | 112 |
| Result | Bending elastic modulus |  | MPa | 20000 | 16500 | 6000 | 13800 | 14200 | 17200 | 15300 |
|     | Tracking resistance |  | V | 400 | 450 | >600 | >600 | >600 | 500 | 500 |
|     | Relative permittivity |  |  | 3.7 | 3.6 | 2.7 | 3.0 | 3.2 | 3.5 | 3.5 |
|     | Dielectric tangent |  |  | 0.026 | 0.020 | 0.005 | 0.006 | 0.007 | 0.015 | 0.015 |
|     | Continuous moldability |  | Shots | 162 | 189 | 31 | 142 | 60 | 180 | 210 |

What is claimed is:

1. A heat-curable resin composition for semiconductor encapsulation, comprising:
   (A) an epoxy resin other than a silicone-modified epoxy resin, being solid at 25° C.;
   (B) a silicone-modified epoxy resin;
   (C) a cyclic imide compound having, in one molecule, at least one dimer acid backbone, at least one linear alkylene group having not less than 6 carbon atoms, at least one alkyl group having not less than 6 carbon atoms, and at least two cyclic imide groups;
   (D) an organic filler; and
   (E) an anionic curing accelerator.

2. The heat-curable resin composition for semiconductor encapsulation according to claim 1, wherein the silicone-modified epoxy resin (B) is an addition compound of an alkenyl group-containing epoxy compound and an organohydrogenpolysiloxane represented by the following average formula (1):

$$H_a R^1_b SiO_{(4-(a+b))/2} \quad (1)$$

wherein $R^1$ independently represents a monovalent hydrocarbon group having 1 to 10 carbon atoms; a represents a positive number of $0.01 \leq a \leq 1$; b represents a positive number of $1 \leq b \leq 3$; and a and b satisfy $1.01 \leq a+b < 4$.

3. The heat-curable resin composition for semiconductor encapsulation according to claim 1, wherein the component (C) is a cyclic imide compound being solid at 25° C.

4. The heat-curable resin composition for semiconductor encapsulation according to claim 1, wherein the cyclic imide compound as the component (C) is represented by the following general formula (2):

wherein A independently represents a tetravalent organic group having an aromatic or aliphatic ring; B represents an alkylene chain having 6 to 18 carbon atoms and a divalent aliphatic ring that may contain a hetero atom; Q independently represents a linear alkylene group having not less than 6 carbon atoms; R independently represents a linear or branched alkyl group having not less than 6 carbon atoms; n represents a number of 1 to 10; and m represents a number of 0 to 10.

5. The heat-curable resin composition for semiconductor encapsulation according to claim 4, wherein A in the general formula (2) has any one of the following structures:

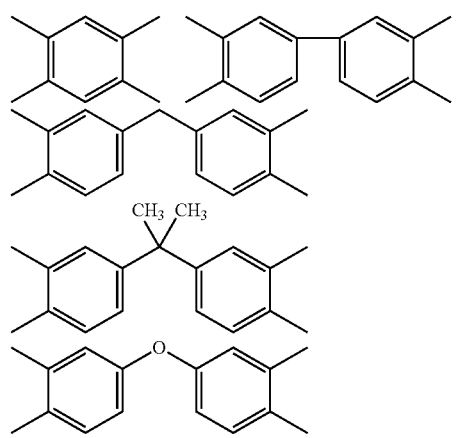

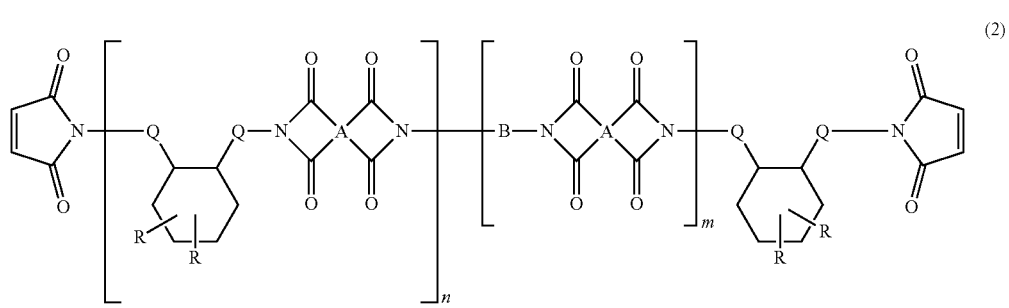

(2)

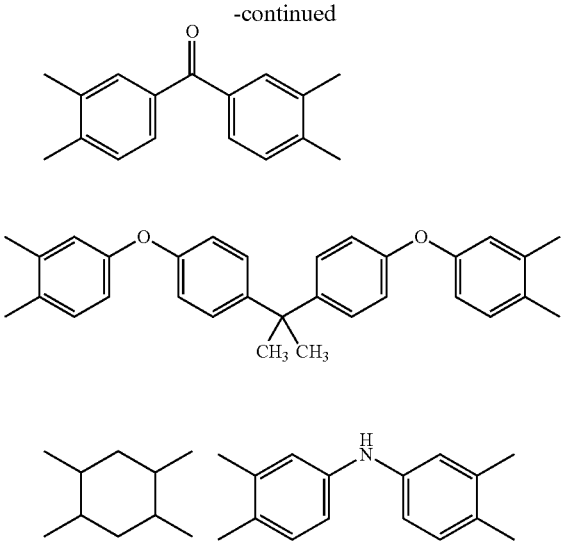
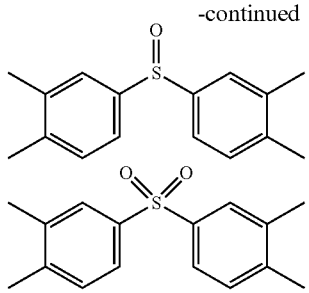
wherein bonds in the above structural formulae that are yet unbonded to substituent groups are to be bonded to carbonyl carbons forming cyclic imide structures in the general formula (2).
6. A semiconductor device encapsulated by a cured product of the heat-curable resin composition for semiconductor encapsulation according to claim 1.
\* \* \* \* \*